(12) United States Patent
Raorane

(10) Patent No.: US 11,594,493 B2
(45) Date of Patent: Feb. 28, 2023

(54) CERAMIC INTERPOSERS FOR ON-DIE INTERCONNECTS

(71) Applicant: Intel Corporation, Santa Clara, CA (US)

(72) Inventor: Digvijay Ashokkumar Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/921,469

(22) Filed: Jul. 6, 2020

(65) Prior Publication Data

US 2021/0028117 A1   Jan. 28, 2021

Related U.S. Application Data

(63) Continuation of application No. 16/236,016, filed on Dec. 28, 2018, now Pat. No. 10,707,169.

(51) Int. Cl.
*H01L 23/538* (2006.01)
*H01L 23/31* (2006.01)
(Continued)

(52) U.S. Cl.
CPC ...... *H01L 23/5384* (2013.01); *H01L 21/4853* (2013.01); *H01L 21/563* (2013.01); *H01L 21/565* (2013.01); *H01L 23/15* (2013.01); *H01L 23/3121* (2013.01); *H01L 23/3135* (2013.01); *H01L 23/3675* (2013.01); *H01L 23/5381* (2013.01); *H01L 23/5385* (2013.01); *H01L 23/5386* (2013.01); *H01L 24/16* (2013.01); *H01L 24/81* (2013.01); *H01L 25/0655* (2013.01); *H01L 25/50* (2013.01); *H01L 24/32* (2013.01); *H01L 24/73* (2013.01);
(Continued)

(58) Field of Classification Search
CPC . H01L 23/5384; H01L 23/15; H01L 23/3121; H01L 23/3135; H01L 23/3675; H01L 23/5381; H01L 23/5385; H01L 23/5386; H01L 21/4853; H01L 21/563; H01L 21/565; H01L 24/16; H01L 24/81; H01L 24/32; H01L 24/73; H01L 2224/16227; H01L 2224/16235; H01L 2224/29111; H01L 2224/32245; H01L 2224/73253; H01L 25/0655; H01L 25/50; H01L 2924/1434; H01L 2924/3511
USPC ........................................................ 257/668
See application file for complete search history.

(56) References Cited

U.S. PATENT DOCUMENTS 8,138,023 B2   3/2012  Egawa
9,607,967 B1 *  3/2017  Shih .................... H01L 25/0657
(Continued)

OTHER PUBLICATIONS

"Microplex Hermetic via Fill for Ceramic Thick or Thin Film Circuits", Microplex, Inc. [Internet] www.microplexinc.com ceramic_hf.html, (accessed on Apr. 26, 2019), 2 pgs.
(Continued)

*Primary Examiner* — Tu-Tu V Ho
(74) *Attorney, Agent, or Firm* — Schwegman Lundberg & Woessner, P.A.

(57) ABSTRACT

Ceramic interposers in a disaggregated-die semiconductor package allow for useful signal integrity and interconnecting components. Low-loss ceramics are used to tune ceramic interposers for a die assembly that may have components from different process-technology nodes.

18 Claims, 8 Drawing Sheets

(51) Int. Cl.
  *H01L 23/15* (2006.01)
  *H01L 25/065* (2023.01)
  *H01L 23/367* (2006.01)
  *H01L 25/00* (2006.01)
  *H01L 23/00* (2006.01)
  *H01L 21/48* (2006.01)
  *H01L 21/56* (2006.01)

(52) U.S. Cl.
  CPC ............... *H01L 2224/16227* (2013.01); *H01L 2224/16235* (2013.01); *H01L 2224/29111* (2013.01); *H01L 2224/32245* (2013.01); *H01L 2224/73253* (2013.01); *H01L 2924/1434* (2013.01); *H01L 2924/3511* (2013.01)

(56) References Cited

U.S. PATENT DOCUMENTS

| | | | |
|---|---|---|---|
| 9,679,878 B1* | 6/2017 | Lin | .................... H01L 21/76802 |
| 10,707,169 B1 | 7/2020 | Raorane | |
| 2013/0049202 A1 | 2/2013 | Tani et al. | |
| 2014/0321803 A1* | 10/2014 | Thacker | ............... G02B 6/4274 |
| | | | 385/14 |
| 2015/0221571 A1 | 8/2015 | Chaparala et al. | |
| 2016/0260661 A1* | 9/2016 | Fukasawa | ............. H01L 21/486 |
| 2018/0220532 A1 | 8/2018 | Hayashi | |
| 2018/0366448 A1 | 12/2018 | Watanabe | |
| 2019/0326266 A1* | 10/2019 | Traverso | ............. H01L 21/4846 |
| 2020/0211966 A1 | 7/2020 | Raorane | |

OTHER PUBLICATIONS

"U.S. Appl. No. 16/236,016, Non Final Office Action dated Dec. 10, 2019", 12 pgs.

"U.S. Appl. No. 16/236,016, Response filed Jan. 10, 2020 to Non Final Office Action dated Dec. 10, 2019", 13 pgs.

"U.S. Appl. No. 16/236,016, Notice of Allowance dated Feb. 28, 2020", 5 pgs.

U.S. Appl. No. 16/236,016 U.S. Pat. No. 10,707,169, filed Dec. 28, 2018, Ceramic Interposers for On-Die Interconnects.

* cited by examiner

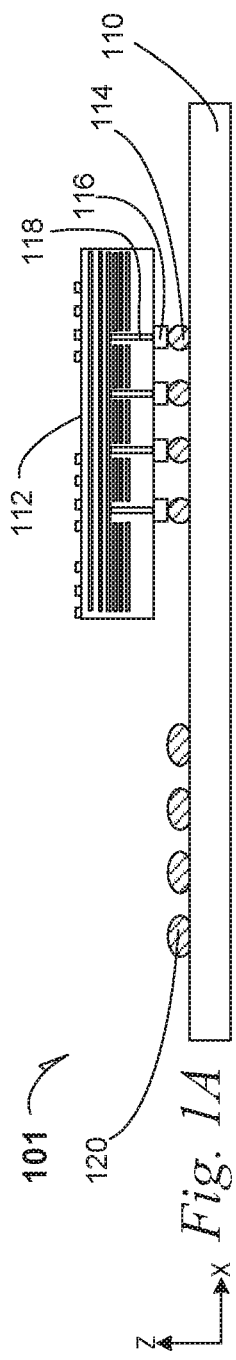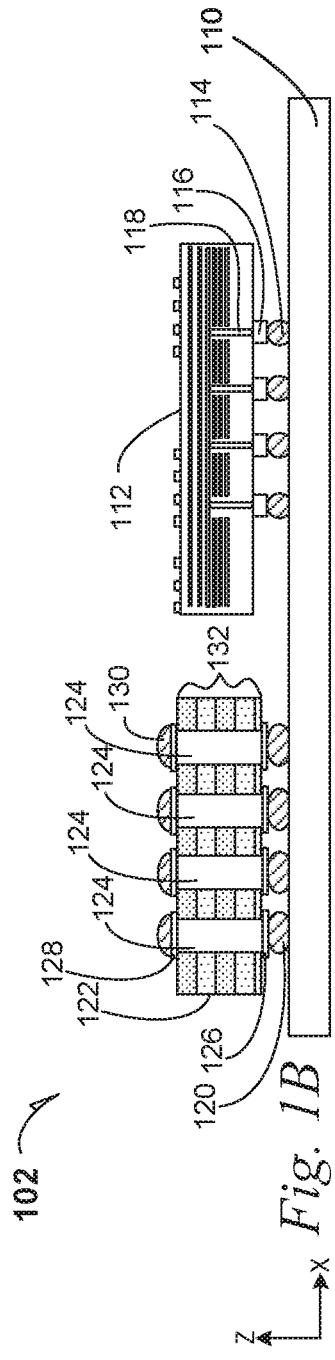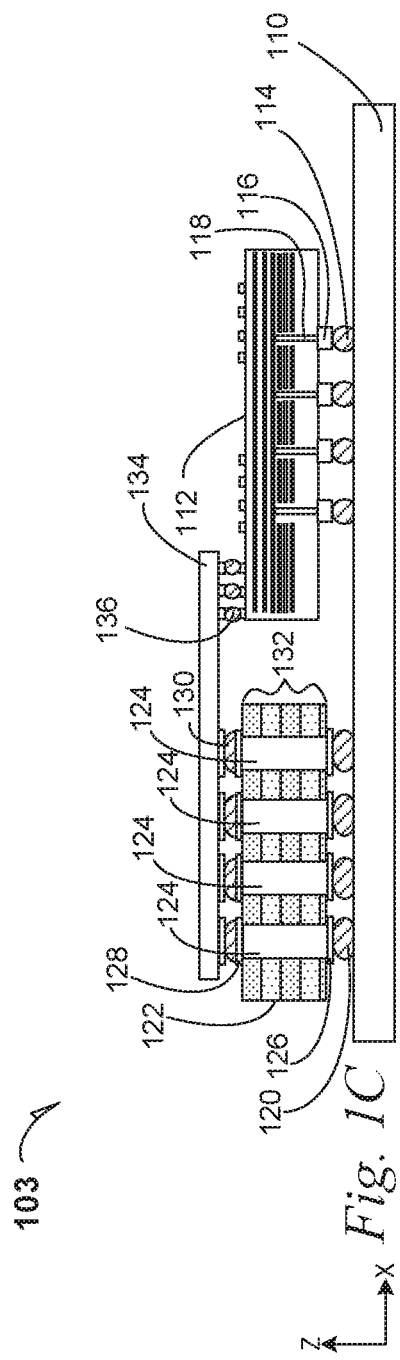

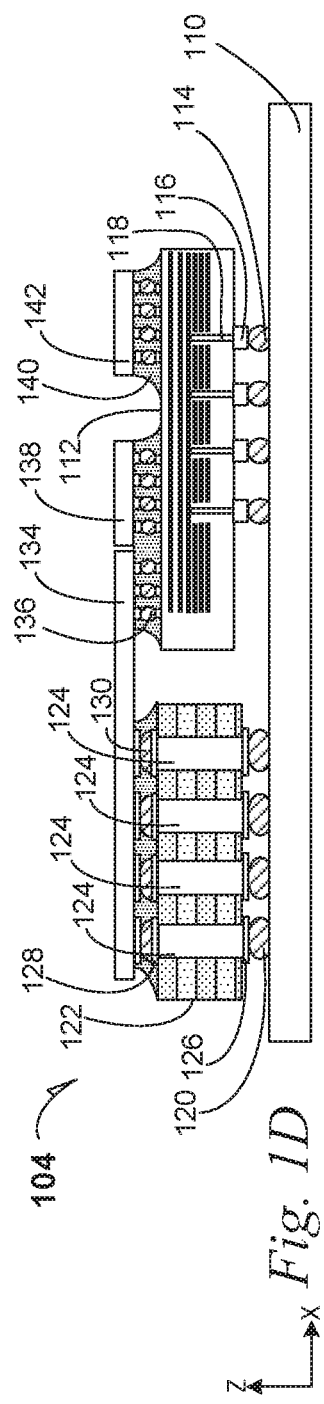
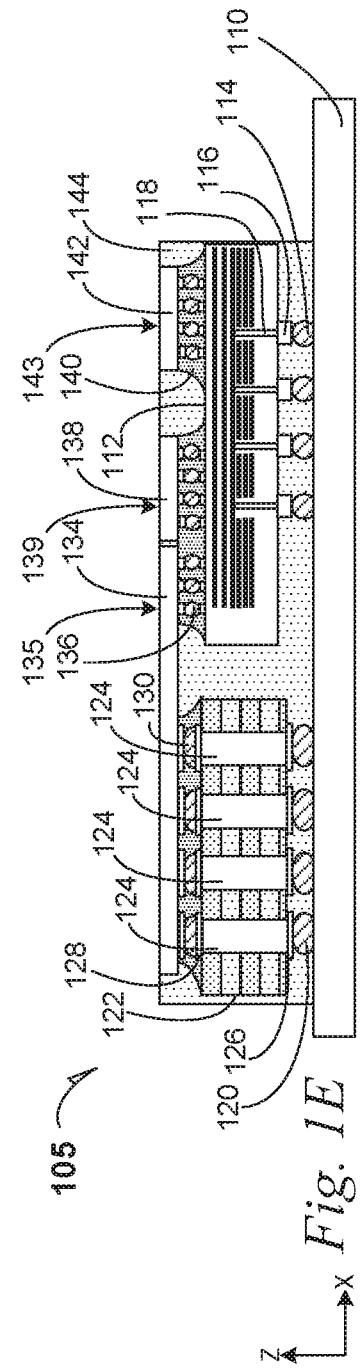
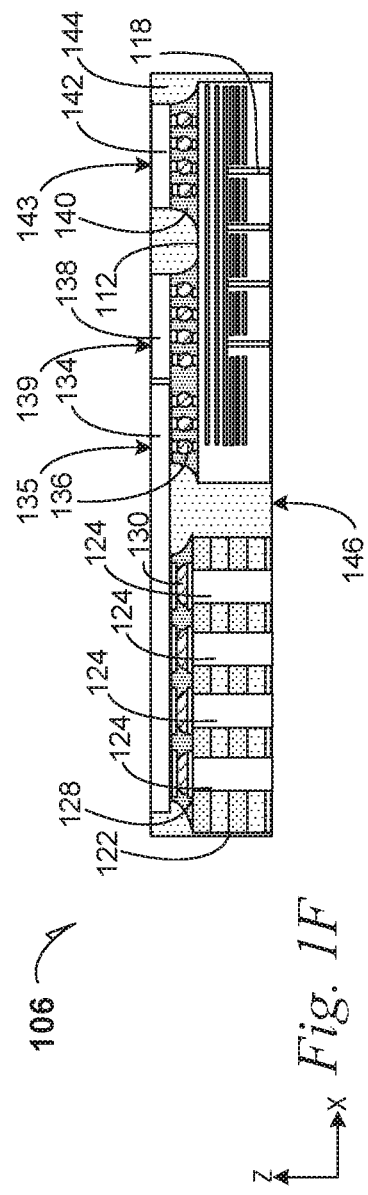

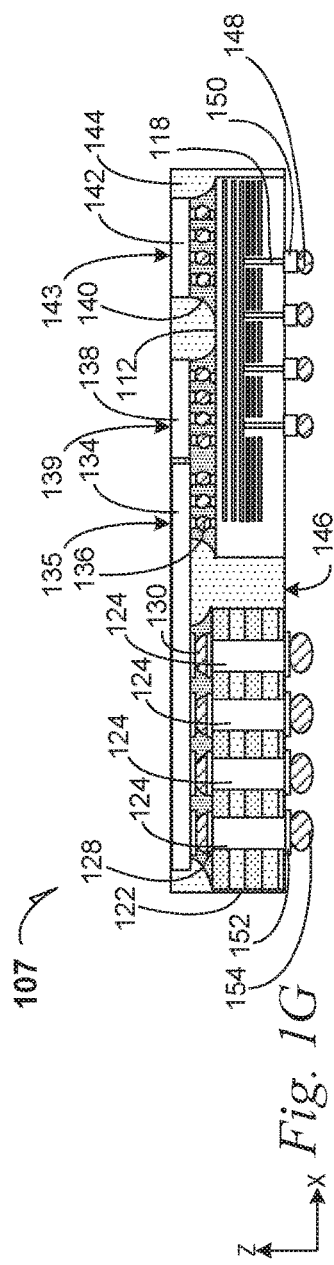

CERAMIC INTERPOSERS FOR ON-DIE INTERCONNECTS

PRIORITY APPLICATION

This application is a continuation of U.S. application Ser. No. 16/236,016, filed Dec. 28, 2018, which is incorporated herein by reference in its entirety.

FIELD

This disclosure relates to interconnects in die-disaggregation technologies for semiconductor device packages.

BACKGROUND

Semiconductive device miniaturization during packaging includes challenges to preserve improve useful signals between devices in packages.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation during fabrication of a ceramic interposer in a semiconductor device package according to an embodiment;

FIG. 1B is a cross-section elevation of a ceramic interposer in the semiconductor device package 101 depicted in FIG. 1A after further processing according to an embodiment;

FIG. 1C is a cross-section elevation of the ceramic interposer in the semiconductor device package depicted in FIG. 1B after further processing according to an embodiment;

FIG. 1D is a cross-section elevation of the ceramic interposer in the semiconductor device package depicted in FIG. 1C after further processing according to an embodiment;

FIG. 1E is a cross-section elevation of the ceramic interposer in the semiconductor device package depicted in FIG. 1D after further processing according to an embodiment;

FIG. 1F is a cross-section elevation of the ceramic interposer in the semiconductor device package depicted in FIG. 1E after further processing according to an embodiment;

FIG. 1G is a cross-section elevation of the ceramic interposer in the semiconductor device package depicted in FIG. 1F after further processing according to an embodiment;

FIG. 1H is a cross-section elevation of the ceramic interposer in the disaggregated die depicted in FIG. 1G after further processing according to an embodiment;

DETAILED DESCRIPTION

Figure 2:
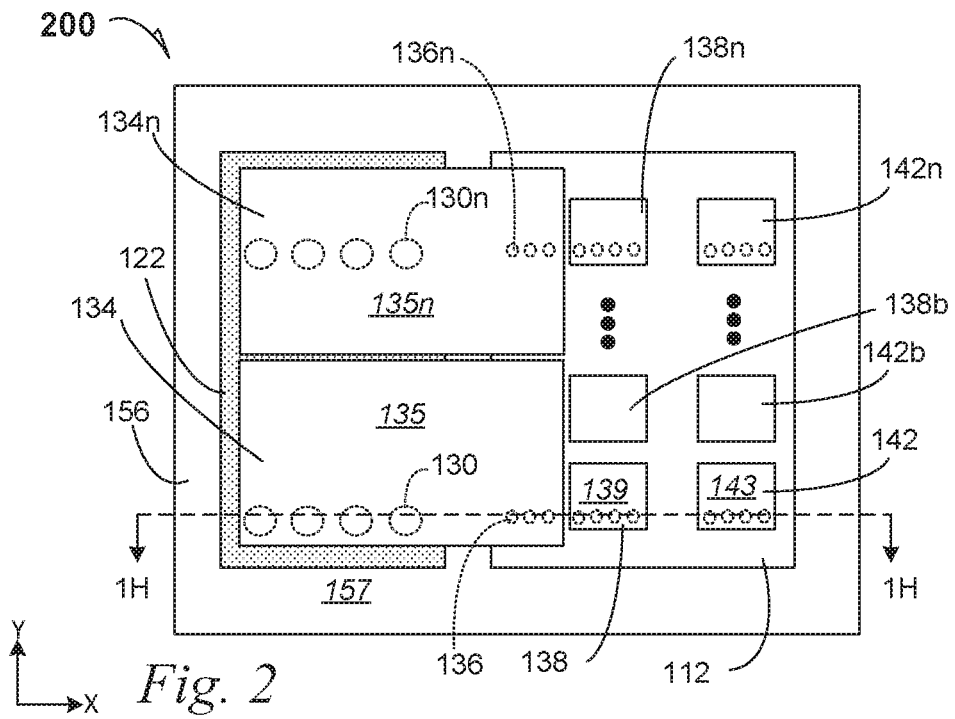
FIG. 2 is a top plan of a ceramic interposer-containing disaggregated-die semiconductor device package, taken along a section line 1H-1H from FIG. 1H according to several embodiments.

Ceramic interposers are assembled in die-disaggregation package embodiments. A ceramic interposer embodiment is a spacer between an I/O chip and a package substrate according to several embodiments. Copper-pillar interconnects that pass through the ceramic interposers, have a lower copper-diffusion issues compared to copper pillars in silicon interposers. Different ceramic chemistries are used depending upon useful applications as die-disaggregation packages are assembled and modified. It is more useful to find ceramic material among several choices, to get useful electrical properties, than to dope silicon, where silicon has a limited number of dopant choices. For example signal loss in a copper pillar that passes through useful ceramic materials, may be lowered by using less lossy ceramic dielectrics. An input-output (I/O) chip is assembled to the ceramic interposer, which bridges to a silicon interposer that supports other chips in a die-disaggregation computing system such as a chipset.

FIG. 1A is a cross-section elevation during fabrication of a ceramic interposer in a semiconductor device package 101 according to an embodiment. A carrier 110 such as a glass or semiconductor material 110 is provided for useful flatness during assembly. Flatness requirements change depending upon a given application and a given technology node, such as silicon design rules and packaging design rules, when combined.

In an embodiment, a bottom die 112 such silicon interposer 112 is seated on the carrier 110 and it is assembled to the carrier 110 by at least a bump 114 such as a solder bump 114, to make use of the specific flatness of the carrier 110 for orienting the bottom die 112. In an embodiment, the bump 114 is contacted with a pillar 116 such as a copper pillar 116 that couples to a through-silicon via (TSV) 118. In and embodiment, the bottom die 112 has no TSV.

During assembly of the semiconductor device package 101, bumps 120 for a ceramic interposer are seated on the carrier 110, either before or after the assembly of the bumps 114 for the bottom die 112.

FIG. 1B is a cross-section elevation of a ceramic interposer in the semiconductor device package 101 depicted in FIG. 1A after further processing according to an embodiment. The semiconductor device package 102 has received a ceramic interposer 122, as it has been seated on the bumps 120. Assembling the silicon interposer 112 and the ceramic interposer 122 upon respective bumps 114 and 120, is done to achieve useful interposer heights in the Z-direction, that match or substantially match in at least one of top- and bottom Z-heights of the interposers after a completed ceramic interposer-containing semiconductor device package has been accomplished.

As illustrated, the ceramic interposer 122 includes several through-ceramic interconnect (TCI) pillars 124 (four occurrences illustrated, but not limited), each to a land side pad 126 and to a die side pad 128. In an embodiment, the die side pads 128 are interconnecting bumped 130 to contact an interconnecting die. In an embodiment, the diameter (X-Y metric) of a TCI pillar 124 is in a range from 50 micrometer (μm) to 100 μm. In an embodiment, the diameter of the TCI pillar 124 is in a range from 70 μm to 80 μm.

The ceramic interposer 122 has an interposer body 132 that is made from several layers of ceramic according to an embodiment. In an embodiment, the coefficient of thermal expansion (CTE) of the interposer body 132 is selected from materials to essentially match the CTE of the silicon interposer 112, such that during field use, thermal stressing behavior is minimized between the ceramic interposer 122 and the silicon interposer 112. As deployed, the ceramic interposer 122 resist brittle failure more than the silicon interposer 112, such that greater strength to the overall package is provided by the ceramic interposer 122. This brittle-failure resistance, increases yield during assembly.

In an embodiment, the several layers of the interposer body 132 are of the same material, such as a strontium titanate material. In an embodiment, the several layers of the interposer body 132 are of alternating materials, such as a strontium titanate material, and a barium titanate material. Other materials and choices are disclosed. In an embodiment, a hafnium oxide is used.

In an embodiment, the thickness (Z-direction) of the ceramic interposer 122 is in a range from 70 μm to 12.0 μm. In an embodiment, the thickness of the ceramic interposer 122 is in a range from 80 μm to 100 μm.

FIG. 1C is a cross-section elevation of the ceramic interposer in the semiconductor device package 102 depicted in FIG. 1B after further processing according to an embodiment. The semiconductor device package 103 has been processed by seating an interconnecting semiconductive device 134 on the ceramic interposer 122 and also contacting a portion of the interconnecting semiconductive device 134 to the silicon interposer 112 by a contact such as an electrical bump 136. In an embodiment, the interconnecting semiconductive device 134 is an input-output (I/O) chip 134.

FIG. 1D is a cross-section elevation of the ceramic interposer in the semiconductor device package 103 depicted in FIG. 1C after further processing according to an embodiment. The semiconductor device package 104 has been processed by seating a first semiconductive device 138 and a subsequent semiconductive device 142 on the silicon interposer 112, where the first semiconductive device 138 is assembled next to the interconnecting semiconductive device 134. In an embodiment, the first semiconductive device 138 and subsequent semiconductive device 142, are seated upon contacts similar to the electrical bump 136, to achieve a useful Z-height to match the interconnecting semiconductive device 134.

Processing is continued in an embodiment, by forming an underfill material 140 beneath the several dies 134, 138 and 142. In an embodiment, a die other than the interconnecting die 134, may be referred to as a chiplet, e.g. the semiconductive devices 138 and 142. A chiplet may be referred to as such as part of a disaggregated-die semiconductive device, such as the packaged semiconductive device 107 depicted in FIG. 1G. The package semiconductive device 107, may also be referred to as a semiconductor device package 107.

In an embodiment, the top not pre-provided with underfill material, such that no underfill processing is required, and the overmolding mass 144 both underfills between the ceramic interposer 122 and the top dies 134, 138 and 142, as well as the overmolding mass 144 takes the perimeter form factor depicted in FIG. 1E.

FIG. 1E is a cross-section elevation of the ceramic interposer in the semiconductor device package 104 depicted in FIG. 1D after further processing according to an embodiment. The semiconductor device package 105 has been processed by overmolding a mass 144, onto the carrier 110 and covering most of the structures assembled on the carrier 110.

In an embodiment, the respective backsides 135, 139 and 143 of the dies 134, 138 and 142 are not covered. In this processing embodiment, the overmolding mass 144 is removed or not located on the respective backsides 135, 139 and 143, to facilitate heat exchange from the several dies 134, 138 and 142.

FIG. 1F is a cross-section elevation of the ceramic interposer in the semiconductor device package 105 depicted in FIG. 1E after further processing according to an embodiment. The semiconductor device package 106 has been processed by removing the carrier 110, grinding off any or some of the contacts (see items 114, 116, 120 and 126 in FIG. 1E) to achieve an exposed surface 146 of useful flatness according to a given embodiment. In an embodiment, any or some of the contacts are retained depending upon a useful application.

In any event, a useful flatness of the exposed surface 146, allows for assembly of electrical bumps to the semiconductor device package 106, as a "reconstituted die" 106 or also referred to as a "disaggregated die" 106.

In an embodiment, the interconnecting semiconductive device 134 is fabricated at an older silicon-fabrication node, such as 22 nanometer (nm), and the first semiconductive device 138 is fabricated at a newer silicon-fabrication node, such as 14 nm, but the ceramic interposer 122 allows for assembly of the interconnecting semiconductive device 134 and the first semiconductive device 138, into a unitary disaggregated-die semiconductor device 106.

FIG. 1G is a cross-section elevation of the ceramic interposer in the semiconductor device package 106 depicted in FIG. 1F after further processing according to an embodiment. The semiconductor device package 107 has been processed by re-bumping the silicon interposer 112 and the ceramic interposer 122, to facilitate useful and uniform flatness of a "reconstituted die" also referred herein to as a "disaggregated die" semiconductor device package 107. In an embodiment, a bump 148 such as a solder bump 148 is contacted to a pillar 150, which has been contacted to the TSV 118. Similarly, a first-level interconnect, die-side pad 152 has been contacted to a TCI 124, and a bump 154 such as a solder bump has been contacted to the die-side pad 152. The designation "die-side pad" 152 is in reference to a disaggregated die such as the disaggregated die 107 as depicted. As assembled, the disaggregated die 107 is prepared to be seated upon a semiconductor package substrate.

FIG. 1H is a cross-section elevation of the ceramic interposer in the disaggregated die 107 depicted in FIG. 1G after further processing according to an embodiment. The semiconductor device package 108 has been processed by seating the disaggregated die 107 as depicted in FIG. 10, upon a semiconductor package substrate 156. After seating the ceramic interposer-containing disaggregated die 107 on the semiconductor package substrate 156, such as by a thermal-compression bonding (TCB) technique, a disaggregated-die underfill 158 is applied between the exposed surface 146 (see FIG. 10) and the semiconductor package substrate 156 at a die side 157. Opposite the die side 157 is a land side 155 for bumping, if useful and mounting upon a board.

As illustrated, the overmolding mass 144 encapsulates a non-total portion of each of the ceramic interposer 122, the bottom die 112, the I/O die 134 and the first chiplet 138. Similarly in an embodiment, the overmolding mass 144 encapsulates a non-total portion of each of the ceramic interposer 122, the bottom die 112, the I/O die 134, the first chiplet 138 and the subsequent chiplet 142.

Accordingly, an interconnecting die 134 that may have an older process-node geometry, which may be larger than the geometry of the first and subsequent dies 138 and 142 according to an embodiment. In an embodiment, the interconnecting die 134 may have an older process-node chemistry compared to process chemistry of the first and subsequent dies 138 and 142. In an embodiment, the interconnecting die may have an older process-node geometry, which may be the same size as that of the first and subsequent dies 138 and 142, but a different architecture. In an embodiment, the interconnecting die may have an older process-node geometry, which may be the same architecture as that of the first and subsequent dies 138 and 142, but a different process chemistry. In an embodiment, the interconnecting die may be fabricated by a different process node, and it is aggregated to at least a first die 138 that may have a newer process-node geometry, which may be smaller or by a process chemistry that is different from that of the interconnecting die 134. In an embodiment, both the first and subsequent dies 138 and 142 are newer-node processed semiconductive devices, and the interconnecting die 134 is and older-node semiconductive device.

In an embodiment, the bottom die 112 is both a memory cache die 112 and a silicon interposer 112 to accommodate the first die 138 and the subsequent die 142, the interconnecting die 134 is seated both on the ceramic interposer 122 and the bottom die 112. As such in an embodiment, the interconnecting die 134 is an I/O chip 134, the first die 138 is a core processor and the subsequent die 1.42 is a memory die 142.

Further assembly in an embodiment includes assembling the semiconductor package substrate 156 to a board 160 such as a printed-wiring motherboard 160 in computing system. In an embodiment, the board 160 includes an external shell 162 that is integral with the board 160 and the external shell 162 provides both physical and dielectric protection for the ceramic interposer-containing disaggregated die 107.

In an embodiment, a heat sink 164, such as a heat slug 164 or an integrated heat spreader (IHS) 164 is attached to the several semiconductive devices 134, 138 and 142 on the die backside surfaces 135, 139 and 143 (see FIG. 1G). In an embodiment, a thermal interface material (TIM) 166 is assembled to the heat sink 164, to bond the several semiconductive devices 134, 138 and 142 to the heat sink 164. In an embodiment, the TIM 166 is a thermal grease. In an embodiment, the TIM 166 is a tin-containing material. In an embodiment, the heat sink 164 is an electronics industry-grade copper material that provide both heat-transfer qualities as well as planarity qualities, to manage thermal warping stress.

FIG. 2 is a top plan of a ceramic interposer-containing disaggregated-die semiconductor device package 200, taken along a section line 1H-1H from FIG. 1H according to several embodiments. Selected structures are indicated but the package 200 does not have all structures illustrated. In an embodiment, assembly of structures to achieve the ceramic interposer-containing disaggregated die semiconductor package 200, are done, but not limited to processing according to techniques disclosed for structures illustrated and described in FIGS. 1A through 1H.

The semiconductor package substrate 156 depicted in FIG. 1H is depicted, but not the overmolding mass 144. The ceramic interposer 122 is seated on the die side 157 of the semiconductor package substrate 156, as is the silicon interposer 112. The interconnecting die 134 is coupled to the respective ceramic and silicon interposers 122 and 112 by the respective interconnecting and I/O bumps 130 and 136 as also illustrated in FIG. 1H. The first and subsequent dies 138 and 142 are seated on the silicon interposer 112 as illustrated in FIG. 1H.

In an embodiment, the interconnecting die 134 is a first interconnecting die 134, and a subsequent interconnecting die 134$n$ is also seated and bridging upon the respective ceramic and silicon interposers 122 and 112. Interconnecting bumps 130 and 130$n$ and I/O bumps 136 and 136$n$ (depicted in hidden, dashed lines), are depicted below the die backside surfaces 135 and 135$n$ of the respective first and subsequent interconnecting dies 134 and 134$n$.

In an embodiment, the first interconnecting die 134 is fabricated from a different process node from that of the subsequent interconnecting die 134$n$.

In an embodiment, the interconnecting die 134 is the only interconnecting die 134 and it takes up space in the Y-direction approximately the distance reached by the footprint of the subsequent interconnecting die 134$n$ (which is not present in this embodiment). The first and subsequent dies 138 and 142 are two of a plurality of dies that occupy space on the silicon interposer 112. In an embodiment, four dies 138, 138$b$, 142 and 142$b$ are on the silicon interposer 112. In an embodiment, six dies 138, 138$b$, 138$n$, 142, 142$b$ and 142$n$ are on the silicon interposer 112. In an embodiment, eight dice including 138 and 142, up to 138$n$ and 142$n$ are on the silicon interposer 112. The chiplet 138$n$ may be referred to as an $N^{th}$ chiplet 138$n$. Similarly, the chiplet 142$n$ may be referred to as an $N^{th}$ subsequent chiplet 142$n$.

In an embodiment, the interconnecting dice 134 and 134$n$, bridge across the respective ceramic and silicon interposers 122 and 112. The first and subsequent dice 138 and 142 are two of a plurality of dice that occupy space on the silicon interposer 112. In an embodiment, four dice 138, 138$b$, 142 and 142$b$ are on the silicon interposer 112. In an embodiment, six dies 138, 138$b$, 138$n$, 142, 142$h$ and 142$n$ are on the silicon interposer 112, and the dies 138$n$ and 142$n$ are of a different process node from that of the dies 138 and 142, as well as the interconnecting die 134 is of a different process node from that of the interconnecting die 134$n$. In an embodiment, eight dies including 138 and 142, up to 138$n$ and 142$n$ are on the silicon interposer 112, and the dies 138$n$ and 142$n$ are of a different process node from that of the dies 138 and 142, as well as the interconnecting die 134 is of a different process node from that of the interconnecting die 134$n$.

It may now be appreciated that die disaggregation techniques in this disclosure may be accommodated by several different process nodes for the several semiconductive devices, facilitated by a different process node for a given interconnecting die, e.g. 134 than a given die, e.g. 138 and 142, 138$b$ and 142$b$ up to 138$n$ and 142$n$ to which the interconnecting die 134 is coupled. Accordingly, a computing system 200 is modularly modifiable by use of the ceramic interposer 122, in subsequent generations, by incrementally replacing a given semiconductive device without requiring total architectural re-design of each semiconductive device.

Figure 3:
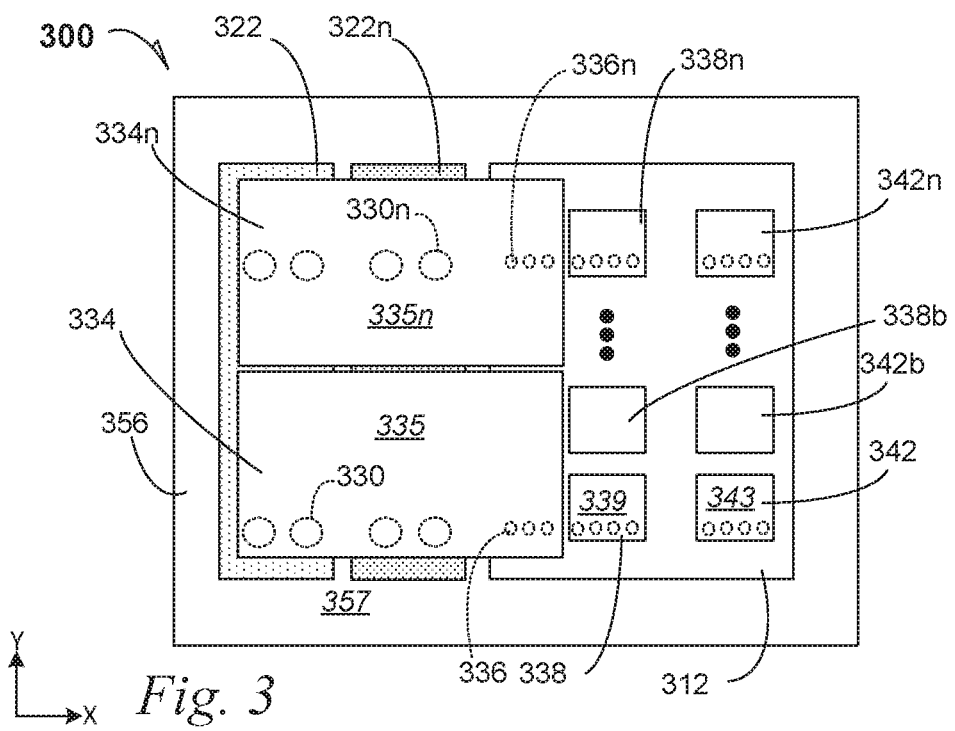
FIG. 3 is a top plan of a ceramic interposer-containing disaggregated-die semiconductor device package according to several embodiments.

FIG. 3 is a top plan of a ceramic interposer-containing disaggregated-die semiconductor device package 300 according to several embodiments. Selected structures are indicated but the package 300 does not have all structures illustrated, similarly to the comparison between FIGS. 2 and 1H. In an embodiment, assembly of structures to achieve the ceramic interposer-containing disaggregated-die semiconductor device package 300, are done according to processing techniques disclosed for structures illustrated and described in FIGS. 1A through 1H and FIG. 2.

In an embodiment, different signal-lossy ceramic materials are used in different regions of a given ceramic interposer, or different lossy ceramic interposers are aggregated to a given semiconductor package substrate, to accommodate different signal quality requirements.

A semiconductor package substrate 356 is depicted without an overmolding mass for clarity. A first ceramic interposer 322 is seated on a die side 357 of the semiconductor package substrate 356, as is a silicon interposer 312. A subsequent ceramic interposer 322n is also seated on the die side 357 of the semiconductor package substrate 356, between the first ceramic interposer 322 and the silicon interposer 312.

In an embodiment, signal loss is lower in the subsequent ceramic interposer 322n compared to the first ceramic interposer 322, such that signal integrity beginning at a given TCI pillar, such as the TCI pillars 124 in previous figures, is achieved, better than through the first ceramic interposer 322. Such TCI pillars are located in contact with and below the interconnecting bumps 330 and 330n.

A first interconnecting die 334 is coupled to the respective first and subsequent ceramic interposers 322 and 322n, and the silicon interposer 312 according to an embodiment.

In an embodiment, both a first interconnecting die 334 and a subsequent interconnecting die 334n, bridge the first and subsequent ceramic interposers 322 and 322n, and by respective interconnecting 330 and I/O bumps 336, as well as respective interconnecting 330n bumps and I/O bumps 336n couple the ceramic interposers 322 and 322n to the respective interconnecting dies 334 and 334n as well as the bottom die 312. In an embodiment, the interconnecting die 334 is a first interconnecting die 334, and a subsequent interconnecting die 334n is also seated and bridging upon the respective ceramic and silicon interposers 322, 322n and 312. Interconnecting bumps 330n and I/O bumps 336n are depicted in hidden, dashed lines.

In an embodiment, the first interconnecting die 334 is fabricated from a different process node from that of the subsequent interconnecting die 334n.

In an embodiment, the interconnecting die 334 is the only interconnecting die 334 and it takes up space in the Y-direction approximately the distance reached by the footprint of the subsequent interconnecting die 334n (which is not present in this embodiment). The first and subsequent dies 338 and 342 are two of a plurality of dies that occupy space on the silicon interposer 312.

In an embodiment, four dies 338, 338b, 342 and 342b are on the silicon interposer 312, signal integrity within the first ceramic interposer 322 is better than in the subsequent ceramic interposer 322n, such that signals that pass through a given TCI pillar within the first ceramic interposer 322, reach the subsequent semiconductive device 342 with similar signal integrity as a signal passing through a TCI pillar in the subsequent ceramic interposer 322n, that reaches a first semiconductive device 338. In an embodiment, signal integrity within the subsequent ceramic interposer 322n is less lossy than in the first ceramic interposer 322.

In an embodiment, six dies 338, 338b, 338n, 342, 342b and 342n are on the silicon interposer 312, signal integrity within the first ceramic interposer 322 is better than in the subsequent ceramic interposer 322n, such that signals that pass through a given TCI pillar within the first ceramic interposer 322, reach the subsequent semiconductive device 342 with similar signal integrity as a signal passing through a TCI pillar in the subsequent ceramic interposer 322n, that reaches a first semiconductive device 338. In an embodiment, signal integrity within the subsequent ceramic interposer 322n is less lossy than in the first ceramic interposer 322.

In an embodiment, eight dies including 338 and 342, up to 338n and 342n are on the silicon interposer 312, signal integrity within the first ceramic interposer 322 is better than in the subsequent ceramic interposer 322n, such that signals that pass through a given TCI pillar within the first ceramic interposer 322, reach the subsequent semiconductive device 342 with similar signal integrity as a signal passing through a TCI pillar in the subsequent ceramic interposer 322n, that reaches a first semiconductive device 338. In an embodiment, signal integrity within the subsequent ceramic interposer 322n is less lossy than in the first ceramic interposer 322.

In an embodiment, the interconnecting dies 334 and 334n, bridge across the respective ceramic and silicon interposers 322, 322n and 312. The first and subsequent dies 338 and 342 are two of a plurality of dies that occupy space on the silicon interposer 312. In an embodiment, four dies 338, 338b, 342 and 342b are on the silicon interposer 312. In an embodiment, six dies 338, 338b, 338n, 342, 342b and 342n are on the silicon interposer 312, and the dies 338n and 342n are of a different process node from that of the dies 338 and 342, as well as the interconnecting die 334 is of a different process node from that of the interconnecting die 334n. In an embodiment, eight dies including 338 and 342, up to 338n and 342n are on the silicon interposer 312, and the dies 338n and 342n are of a different process node from that of the dies 338 and 342, as well as the interconnecting die 334 is of a different process node from that of the interconnecting die 334n.

It may now be appreciated that die disaggregation techniques in this disclosure may be accommodated by several different process nodes for the several semiconductive devices, facilitated by a different process node for a given interconnecting die, e.g. 334 than a given die, e.g. 338 to which it is coupled, and different ceramic lossy materials are used between at least two ceramic interposers, e.g. 322 and 322n. Accordingly, a computing system 300 is modularly modifiable by use of the first and subsequent ceramic interposers 322 and 322n, in subsequent generations, by incrementally replacing a given semiconductive device without requiring total architectural re-design of each semiconductive device. In an embodiment, the arrival of signals originating within the package substrate 356, is preserved in quality by a less lossy ceramic material in the first ceramic interposer 322, than in the subsequent ceramic interposer 322n, such that signal quality arriving at the first devices 338 and 338n is comparable despite the greater distance through the first ceramic interposer 322.

Figure 4:
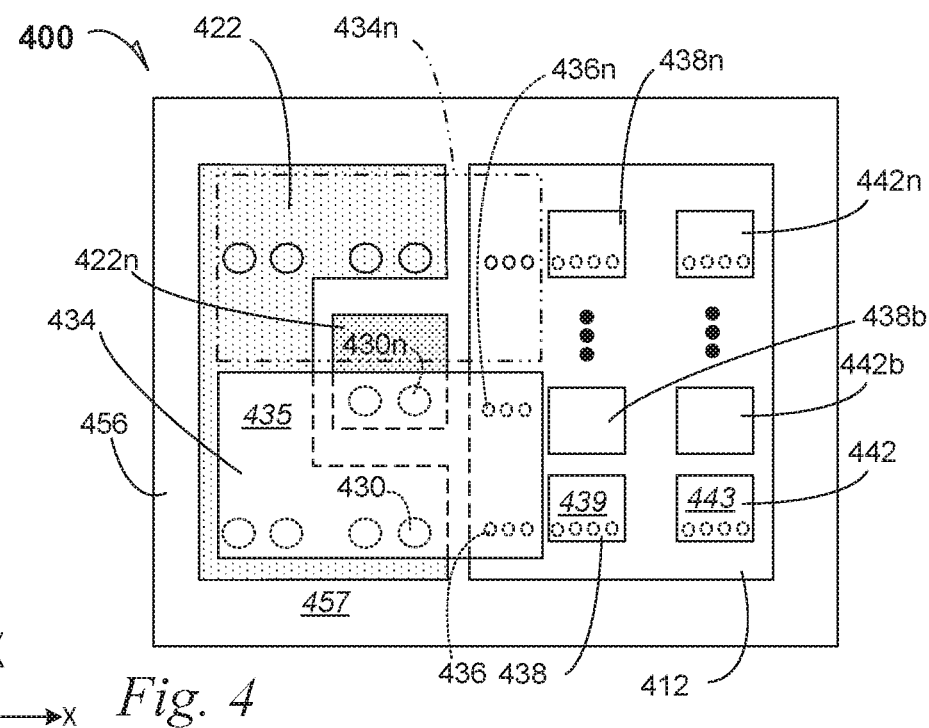
FIG. 4 is a top plan of a ceramic interposer-containing disaggregated-die semiconductor package according to several embodiments.

FIG. 4 is a top plan of a ceramic interposer-containing disaggregated-die semiconductor package 400 according to several embodiments. Selected structures are indicated but the package 400 does not have all structures illustrated. In an embodiment, assembly of structures to achieve the ceramic interposer-containing disaggregated die semiconductor package 400, are done according to techniques disclosed, but not limited to processing for structures illustrated and described in FIGS. 1A through 1H, FIG. 2 and FIG. 3.

In an embodiment, different signal-lossy ceramic materials are used in different regions of a given ceramic interposer, or different lossy ceramic interposers are aggregated to a given semiconductor package substrate, to accommodate different signal quality requirements.

A semiconductor package substrate 456 is depicted without an overmolding mass for clarity. A first ceramic interposer 422 is seated on a die side 457 of the semiconductor package substrate 456, as is a silicon interposer 412. The first ceramic interposer 422 has a shape that accommodates a subsequent ceramic interposer 422n on the die side 457, and adjacent the silicon interposer 412. The subsequent ceramic interposer 422n is also seated on the die side 457 of the semiconductor package substrate 456, and it is semi-circularly surrounded by the first ceramic interposer 422 and adjacent the silicon interposer 412.

In an embodiment, signal loss is lower in the subsequent ceramic interposer 422n compared to the first ceramic interposer 422, such that signal integrity beginning at a given TCI pillar, such as the TCI pillars 124 in previous figures, is achieved, better than through the first ceramic interposer 422.

A first interconnecting die 434 is coupled to the respective first and subsequent ceramic interposers 422 and 422n, and the silicon interposer according to an embodiment.

In an embodiment, both a first interconnecting die 434 and a subsequent interconnecting die 434n (footprint only), bridge the first and subsequent ceramic interposers 422 and 422n, and by respective interconnecting bumps 430 and I/O bumps 436, as well as respective interconnecting bumps 430n and I/O bumps 436n couple the ceramic interposers 422 and 422n to the respective interconnecting dies 434 and 434n as well as the bottom die 412. In an embodiment, the interconnecting die 434 is a first interconnecting die 434, and a subsequent interconnecting die 434n is also seated and bridging upon the respective ceramic interposers 422, 422n and the silicon interposer 412. Interconnecting bumps 430n and I/O bumps 436n are depicted in hidden, dashed lines.

In an embodiment, a disaggregated-die package 400 is upgraded by replacing a die in the position 438b, with a newer-process-node semiconductive device 438b, such that a master-slave relationship is achieved and a low-lossy ceramic interposer 422n is tuned to expedite signal integrity most closely linked to the newer-process-node semiconductive device 438b.

In an embodiment, the first interconnecting die 434 is fabricated from a different process node from that of the subsequent interconnecting die 434n.

In an embodiment, the interconnecting die 434 is the only interconnecting die 434 and it takes up space in the Y-direction approximately the distance reached by the footprint of the subsequent interconnecting die 434n. The first and subsequent dies 438 and 442 are two of a plurality of dies that occupy space on the silicon interposer 412.

In an embodiment, four dies 438, 438b, 442 and 442b are on the silicon interposer 412, signal integrity within the first ceramic interposer 422 is better than in the subsequent ceramic interposer 422n, such that signals that pass through a given TCI pillar within the first ceramic interposer 422, reach the subsequent semiconductive device 442 with similar signal integrity as a signal passing through a TCI pillar in the subsequent ceramic interposer 422n, that reaches a first semiconductive device 438. In an embodiment, signal integrity within the subsequent ceramic interposer 422n is less lossy than in the first ceramic interposer 422.

In an embodiment, six dies 438, 438b, 438n, 442, 442b and 442n are on the silicon interposer 412, signal integrity within the first ceramic interposer 422 is better than in the subsequent ceramic interposer 422n, such that signals that pass through a given TCI pillar within the first ceramic interposer 422, reach the subsequent semiconductive device 442 with similar signal integrity as a signal passing through a TCI pillar in the subsequent ceramic interposer 422n, that reaches a first semiconductive device 438. In an embodiment, signal integrity within the subsequent ceramic interposer 422n is less lossy than in the first ceramic interposer 422.

In an embodiment, eight dies including 438 and 442, up to 438n and 442n are on the silicon interposer 412, signal integrity within the first ceramic interposer 422 is better than in the subsequent ceramic interposer 422n, such that signals that pass through a given TCI pillar within the first ceramic interposer 422, reach the subsequent semiconductive device 442. with similar signal integrity as a signal passing through a TCI pillar in the subsequent ceramic interposer 422n, that reaches a first semiconductive device 438. In an embodiment, signal integrity within the subsequent ceramic interposer 422n is less lossy than in the first ceramic interposer 422.

In an embodiment, the interconnecting dies 434 and 434n, bridge across the respective ceramic and silicon interposers 422, 422n and 412. The first and subsequent dies 438 and 442 are two of a plurality of dies that occupy space on the silicon interposer 412. In an embodiment, four dies 438, 438b, 442 and 442b are on the silicon interposer 412. In an embodiment, six dies 438, 438b, 438n, 442, 442b and 442n are on the silicon interposer 412, and the dies 438n and 442n are of a different process node from that of the dies 438 and 442, as well as the interconnecting die 434 is of a different process node from that of the interconnecting die 434n. In an embodiment, eight dies including 438 and 442, up to 438n and 442n are on the silicon interposer 412, and the dies 438n and 442n are of a different process node from that of the dies 438 and 442, as well as the interconnecting die 434 is of a different process node from that of the interconnecting die 434n.

It may now be appreciated that die disaggregation techniques in this disclosure may be accommodated by several different process nodes for the several semiconductive devices, facilitated by a different process node for a given interconnecting die, e.g. 434 than a given die, e.g. die 438 to which it is coupled, and different ceramic lossy materials are used between at least two ceramic interposers, e.g. 422 and 422n. Accordingly, a computing system 400 is modularly modifiable by use of the first and subsequent ceramic interposers 422 and 422n, in subsequent generations, by incrementally replacing a given semiconductive device without requiring total architectural re-design of each semiconductive device.

FIGS. 5A through 5E are cross-section elevation details of ceramic interposers that are deployable in semiconductor device package embodiments.

Figure 5A:
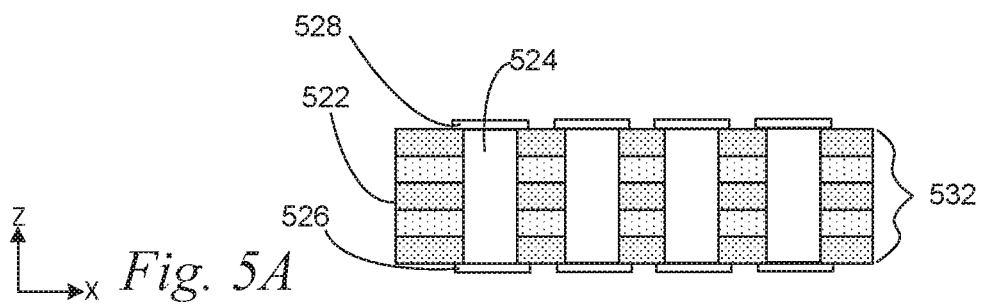
FIGS. 5A through 5E are cross-section elevation details of ceramic interposers that are deployable in semiconductor device package embodiments.

FIG. 5A depicts a ceramic interposer 522 with several through-ceramic interconnect (TCI) pillars 524 that penetrate an interposer body 532, each TCI pillar 524 contacting a land side pad 526 and a die side pad 528. As illustrated, the ceramic interposer 522 is unbumped and is deployable in a semiconductor device package. In an embodiment, the respective land and die side pads 526 and 528 are copper-containing materials.

In an embodiment, the ceramic material of the interposer body 522 is made from alternating layers with different ceramic properties, as illustrated by alternate and differing shading. In an embodiment, more than two types of ceramics are used in the layers, such as three layers with each different ceramic properties. In an embodiment, more than three types of ceramics are used in the layers, such as four layers with each with different ceramic properties.

Figure 5B:
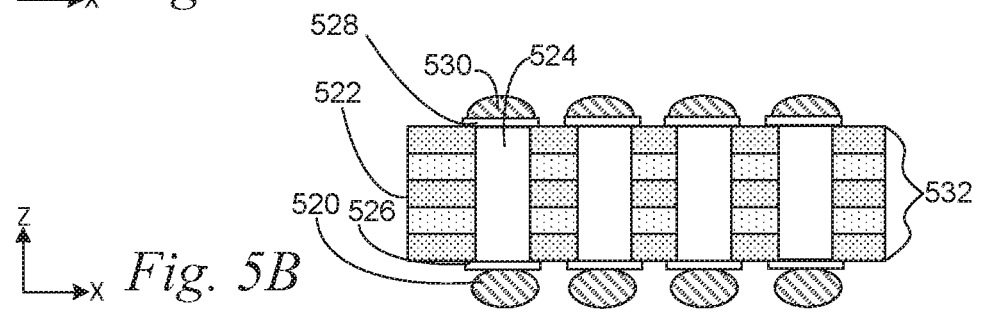

FIG. 5B depicts a ceramic interposer 522 with several TCI pillars 524 that penetrate an interposer body 532, each TCI pillar 524 contacting a land side pad 526 and a die side pad 528. As illustrated, the ceramic interposer 522 is bumped at the die side pads 528 with curvilinear bumps 530, and on the land side pads 526, also with curvilinear bumps 520. In an embodiment, the respective land and die side pads 526 and 528 are copper-containing materials, and the respective bumps 520 and 530 are plated solders.

Figure 5C:
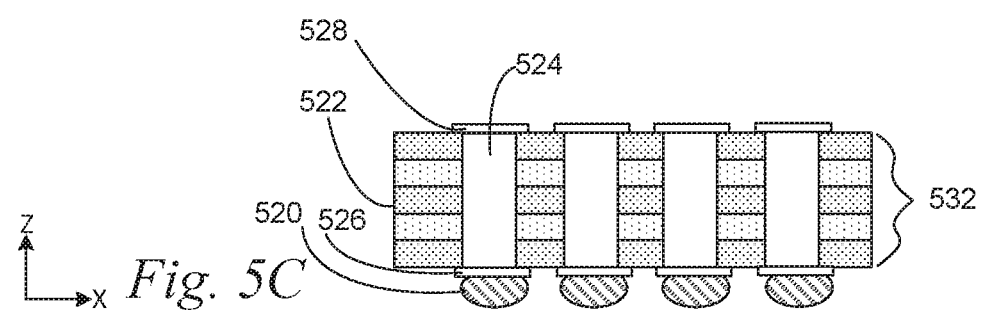

FIG. 5C depicts a ceramic interposer 522 with several TCI pillars 524, that penetrate an interposer body 532, each TCI pillar 524 contacting a land side pad 526 and a die side pad 528. As illustrated, the ceramic interposer 522 is not bumped at the die side pads 528, but is bumped on the land side pads 520 with curvilinear bumps 520. In an embodiment, the respective land and die side pads 526 and 528 are copper-containing materials, and land side bump is a tin-containing plated solder.

Figure 5D:
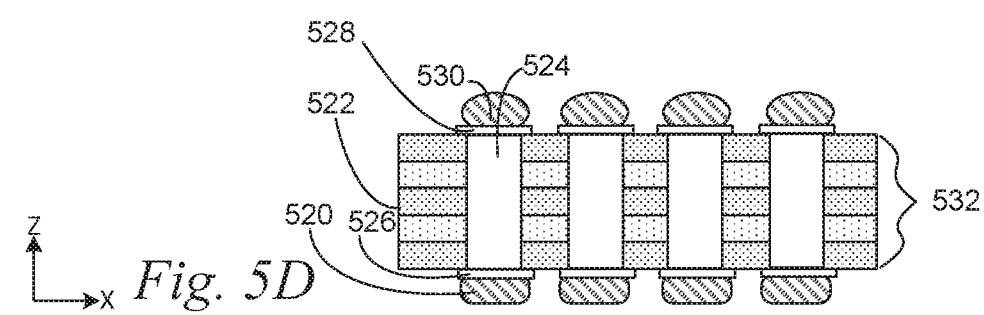

FIG. 5D depicts a ceramic interposer 522 with several TCI pillars 524, that penetrate an interposer body 532, each TCI pillar 524 contacting a land side pad 526 and a die side pad 528. As illustrated, the ceramic interposer 522 bumped at the die side pads 528 with a solder, and it is bumped on the land side pads 526 with tin-containing quasi-rectangular bumps 520. In an embodiment, the respective land and die side pads 526 and 528 are copper-containing materials.

Figure 5E:
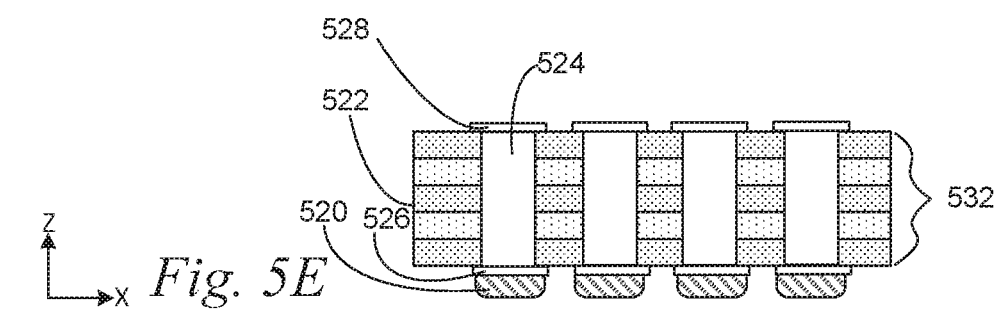

FIG. 5E depicts a ceramic interposer 522 with several TCI pillars 524, that penetrate an interposer body 532, each TCI pillar 524 contacting a land side pad 526 and a die side pad 528. As illustrated, the ceramic interposer 522 is not bumped at the die side pads 528, but is bumped on the land side pads 526 with tin-containing quasi-rectangular bumps 520. In an embodiment, the respective land and die side pads 526 and 528 are copper-containing materials.

Figure 6:
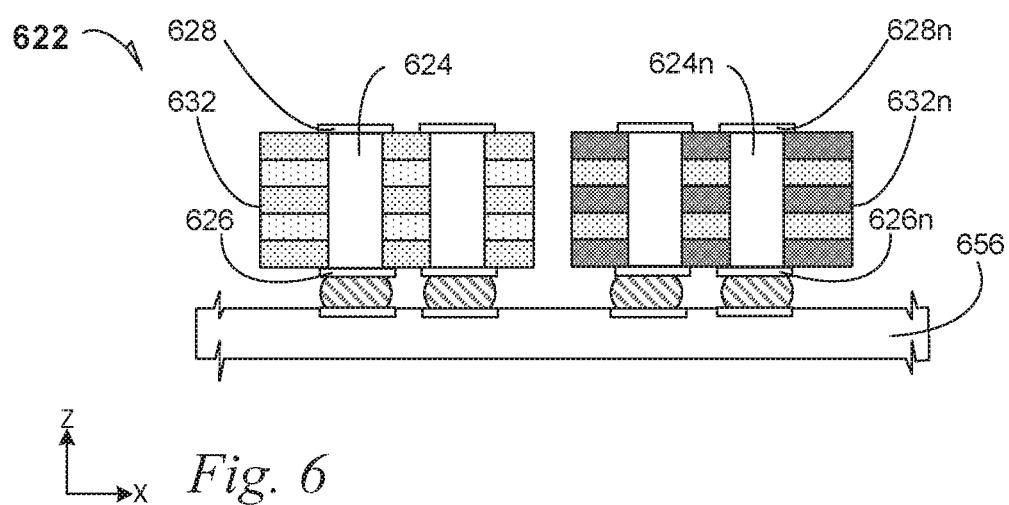
FIG. 6 is a cross-section elevation of a composite ceramic interposer according to several embodiments.

FIG. 6 is a cross-section elevation of a composite ceramic interposer 622 according to several embodiments. Selected structures are indicated, and they may be mapped to the first and subsequent ceramic interposers 322 and 322n as well as to the first and subsequent ceramic interposers 422 and 422n.

In an embodiment, different signal-lossy ceramic materials are used in different ceramic interposers, such as different lossy ceramic interposer bodies 632 and 632n are aggregated to a given semiconductor package substrate 656, to accommodate different signal quality requirements.

The first ceramic interposer body 632 is seated on the semiconductor package substrate 656, as is subsequent ceramic interposer body 632n. In an embodiment, signal loss is lower in the subsequent ceramic interposer body 632n compared to the first ceramic interposer body 632, such that signal integrity beginning at a given TCI pillar, such as the TCI pillar 624n, is achieved, better than through the TCI pillar 624. In an embodiment due to ceramic materials differences, signal loss is lower in the first ceramic interposer body 632, than in the subsequent ceramic interposer body 632n.

In an embodiment, the first ceramic interposer body 632 is made from a barium titanate ($Ba_xTiO_3$) material, where the barium may be either stoichiometrically balanced with the titanate material, or a non-stoichiometric solid solution. In this embodiment, the subsequent ceramic interposer body 632n has a less lossy material than that of the first ceramic interposer body 632. In an embodiment due to ceramic materials differences, signal loss is lower in the first ceramic interposer body 632, than in the subsequent ceramic interposer body 632n.

In an embodiment, the first ceramic interposer body 632 is made from a strontium titanate ($Sr_{(1-x)}TiO_3$) material, where the strontium may be either stoichiometrically balanced with the titanate material, or a non-stoichiometric solid solution. In this embodiment, the subsequent ceramic interposer body 632n has a less lossy material than that of the first ceramic interposer body 632. In an embodiment due to ceramic materials differences, signal loss is lower in the first ceramic interposer body 632, than in the subsequent ceramic interposer body 632n.

In an embodiment, the first ceramic interposer body 632 is made from a magnesium oxide silicate ($2MgOSiO_2$) material, where the magnesium oxide may be either stoichiometrically balanced with the silicate material, or a non-stoichiometric solid solution. In this embodiment, the subsequent ceramic interposer body 632n has a less lossy material than that of the first ceramic interposer body 632. In an embodiment, the first ceramic interposer body 632 is made from a calcium titanate ($Ca_{(1-x)}TiO_3$) material, where the calcium may be either stoichiometrically balanced with the titanate material, or a non-stoichiometric solid solution. In this embodiment, the subsequent ceramic interposer body 632n has a less lossy material than that of the first ceramic interposer body 632. In an embodiment due to ceramic materials differences, signal loss is lower in the first ceramic interposer body 632, than in the subsequent ceramic interposer body 632n.

In an embodiment, the first ceramic interposer body 632 is made from a magnesium titanate ($Mg_{(1-x)}TiO_3$) material, where the magnesium may be either stoichiometrically balanced with the titanate material, or a non-stoichiometric solid solution. In this embodiment, the subsequent ceramic interposer body 632n has a less lossy material than that of the first ceramic interposer body 632. In an embodiment due to ceramic materials differences, signal loss is lower in the first ceramic interposer body 632, than in the subsequent ceramic interposer body 63n.

Figure 7:
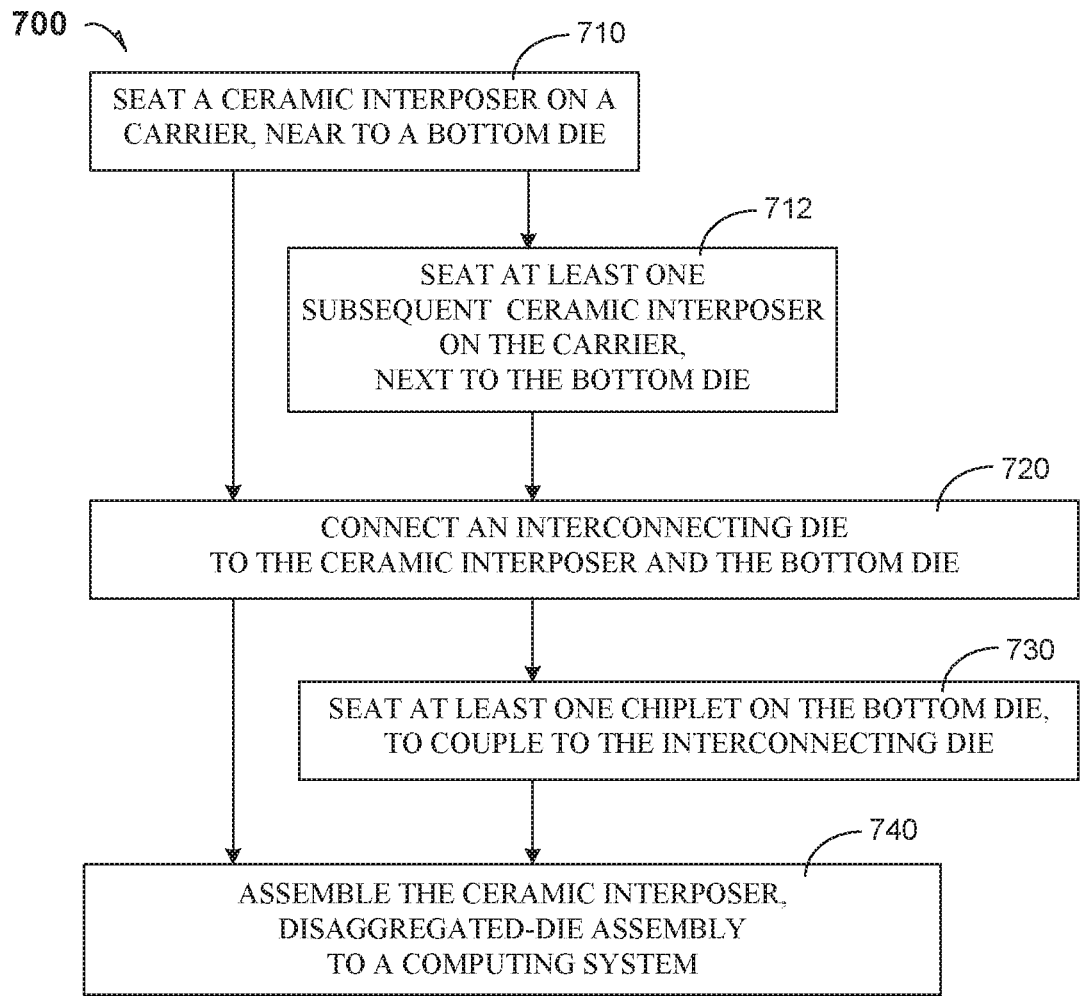
FIG. 7 is a process flow diagram according to several embodiments.

FIG. 7 is a process flow diagram according to several embodiments.

At 710, the process includes seating a ceramic interposer on a carrier near a bottom die such as a silicon interposer.

At 712, the process includes seating a subsequent ceramic interposer on the carrier next to the bottom die.

At 720, the process includes connecting an interconnecting die to the ceramic interposer and to the bottom die.

At 730, the process includes seating at least one chiplet on the bottom die, to couple to the interconnecting die.

At 740, the process includes assembling the ceramic-interposer disaggregated-die assembly to a computing system.

Figure 8:
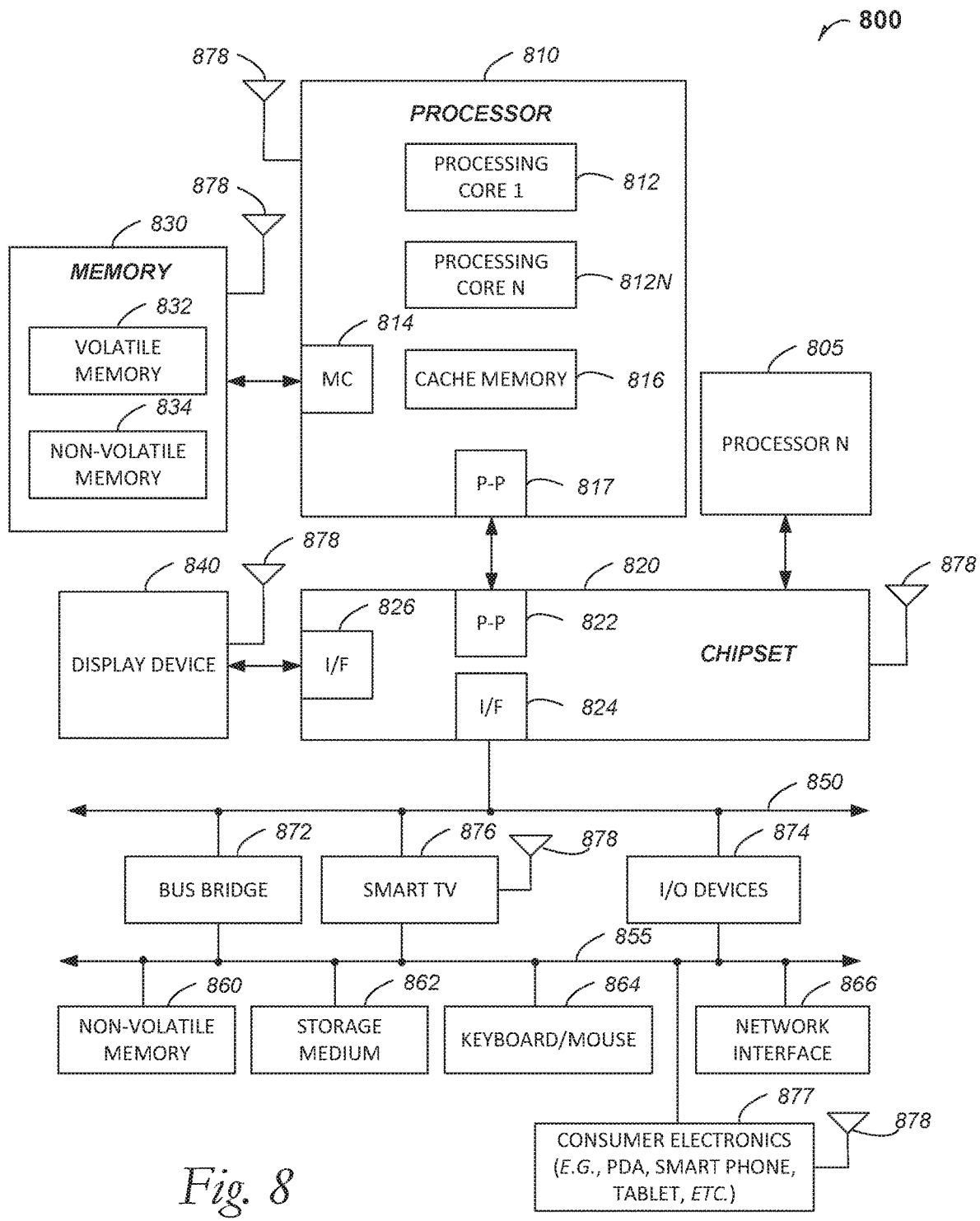
FIG. 8 is included to show an example of a higher-level device application for disclosed embodiments.

FIG. 8 is included to show an example of a higher-level device application for the disclosed embodiments. The ceramic interposer-containing disaggregated-die package embodiments may be found in several parts of a computing system. In an embodiment, the ceramic interposer-containing disaggregated-die package is part of a communications apparatus such as is affixed to a cellular communications tower. In an embodiment, a computing system 800 includes, but is not limited to, a desktop computer. In an embodiment, a system 800 includes, but is not limited to a laptop computer. In an embodiment, a system 800 includes, but is not limited to a netbook. In an embodiment, a system 800 includes, but is not limited to a tablet. In an embodiment, a system 800 includes, but is not limited to a notebook computer. In an embodiment, a system 800 includes, but is not limited to a personal digital assistant (PDA). In an embodiment, a system 800 includes, but is not limited to a server. In an embodiment, a system 800 includes, but is not limited to a workstation. In an embodiment, a system 800 includes, but is not limited to a cellular telephone. In an embodiment, a system 800 includes, but is not limited to a mobile computing device. In an embodiment, a system 800 includes, but is not limited to a smart phone. In an embodiment, a system 800 includes, but is not limited to an internet appliance. In an embodiment, a system 800 includes, but is not limited to a drone. In an embodiment, a system 800 includes, but is not limited to an autonomous land vehicle. In an embodiment, a system 800 includes, but is not limited to an autonomous water vehicle. Other types of computing devices may be configured with the microelectronic device that includes ceramic interposer-containing disaggregated-die package embodiments.

In an embodiment, the processor 810 has one or more processing cores 812 and 812N, where 812N represents the Nth processor core inside processor 810 where N is a positive integer. In an embodiment, the electronic device system 800 using an embedded magnetic inductor and EMIB die embodiment that includes multiple processors including 810 and 805, where the processor 805 has logic similar or identical to the logic of the processor 810. In an embodiment, the processing core 812 includes, but is not limited to, pre-fetch logic to fetch instructions, decode logic to decode the instructions, execution logic to execute instructions and the like. In an embodiment, the processor 810 has a cache memory 816 to cache at least one of instructions and data for the embedded magnetic inductor and EMIB die in the system 800. The cache memory 816 may be organized into a hierarchal structure including one or more levels of cache memory.

In an embodiment, the processor 810 includes a memory controller 814, which is operable to perform functions that enable the processor 810 to access and communicate with memory 830 that includes at least one of a volatile memory 832 and a non-volatile memory 834. In an embodiment, the processor 810 is coupled with memory 830 and chipset 820. In an embodiment, the chipset 820 is part of a system-in-package with a ceramic interposer-containing disaggregated-die package depicted in FIGS. 1H, 2, 3 and 4. The processor 810 may also be coupled to a wireless antenna 878 to communicate with any device configured to at least one of transmit and receive wireless signals. In an embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 834 includes, but is not limited to, flash memory, phase change memory (PCM), read-only memory (ROM), electrically erasable programmable read-only memory (EEPROM), or any other type of non-volatile memory device.

The memory 830 stores information and instructions to be executed by the processor 810. In an embodiment, the memory 830 may also store temporary variables or other intermediate information while the processor 810 is executing instructions. In the illustrated embodiment, the chipset 820 connects with processor 810 via Point-to-Point (PtP or P-P) interfaces 817 and 822. Either of these PtP embodiments may be achieved using a ceramic interposer-containing disaggregated-die package embodiment as set forth in this disclosure. The chipset 820 enables the processor 810 to connect to other elements in a ceramic interposer-containing disaggregated-die package embodiment in a system 800. In an embodiment, interfaces 817 and 822 operate in accordance with a PtP communication protocol such as the Intel® QuickPath interconnect (QPI) or the like. In other embodiments, a different interconnect may be used.

In an embodiment, the chipset 820 is operable to communicate with the processor 810, 805N, the display device 840, and other devices 872, 876, 874, 860, 862, 864, 866, 877, etc. The chipset 820 may also be coupled to a wireless antenna 878 to communicate with any device configured to at least do one of transmit and receive wireless signals.

The chipset 820 connects to the display device 840 via the interface 826. The display 840 may be, for example, a liquid crystal display (LCD), a plasma display, cathode ray tube (CRT) display, or any other form of visual display device. In an embodiment, the processor 810 and the chipset 820 are merged into a ceramic interposer-containing disaggregated-die package in a computing system. Additionally, the chipset 820 connects to one or more buses 850 and 855 that interconnect various elements 874, 860, 862, 864, and 866. Buses 850 and 855 may be interconnected together via a bus bridge 872 such as at least one ceramic interposer-containing disaggregated-die package apparatus embodiment. In an embodiment, the chipset 820, via interface 824, couples with a non-volatile memory 860, a mass storage device(s) 862, a keyboard/mouse 864, a network interface 866, smart TV 876, and the consumer electronics 877, etc.

In an embodiment, the mass storage device 862 includes, but is not limited to, a solid state drive, a hard disk drive, a universal serial bus flash memory drive, or any other form of computer data storage medium. In one embodiment, the network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the embedded magnetic inductor and a ceramic interposer-containing disaggregated-die package in a computing system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into the processor core 812.

Where useful, the computing system 800 may have a broadcasting structure interface such as for affixing the apparatus to a cellular tower.

To illustrate the embedded magnetic inductor and ceramic interposer-containing disaggregated-die package embodiments and methods disclosed herein, a non-limiting list of examples is provided herein:

Example 1 is a semiconductor device package, comprising: an overmolding mass; a ceramic interposer in the overmolding mass, wherein the ceramic interposer encases a through-ceramic interconnect (TCI) pillar; a bottom semiconductive device (bottom die) in the overmolding mass and adjacent the ceramic interposer, wherein the bottom die includes at least one through-silicon via (TSV); a first semiconductive device (first chiplet) coupled to the bottom die by contact with a first electrical bump; and an interconnecting (I/O) semiconductive device (I/O die) coupled to the TCI pillar by contact with an interconnecting bump, and coupled to the bottom die by an I/O bump, wherein the I/O die and the first chiplet are coupled through the bottom die.

In Example 2, the subject matter of Example 1 optionally includes wherein the bottom die and the ceramic interposer are adjacent each other, wherein the I/O die and the first chiplet are adjacent each other, wherein the I/O die bridges between the ceramic interposer and the bottom die, wherein underfill materials contact the ceramic interposer and the I/O die, the first chiplet and the bottom die, and wherein the overmolding mass encapsulates a non-total portion of each of the ceramic interposer, the bottom die, the I/O die and the first chiplet.

In Example 3, the subject matter of any one or more of Examples 1-2 optionally include wherein the ceramic interposer includes at least two ceramic layers that encase the TCI pillar.

In Example 4, the subject matter of any one or more of Examples 1-3 optionally include wherein the ceramic interposer includes at least two ceramic layers that encase the TCI pillar, wherein each of the at least two ceramic layers is of a different ceramic material.

In Example 5, the subject matter of any one or more of Examples 1-4 optionally include wherein the ceramic interposer includes at least two ceramic layers that encase the TCI pillar, wherein each of the at least two ceramic layers is of a different ceramic material, and wherein the ceramic layers are selected from oxides consisting of the group barium, strontium, hafnium titanium and silicon.

In Example 6, the subject matter of any one or more of Examples 1-5 optionally include wherein the I/O die has an I/O fabrication-size geometry, wherein the first chiplet has a first fabrication-size geometry, and wherein the first fabrication-size geometry is smaller than the I/O fabrication-size geometry.

In Example 7, the subject matter of any one or more of Examples 1-6 optionally include a subsequent chiplet coupled to the bottom die by contact with a subsequent electrical bump.

In Example 8, the subject matter of any one or more of Examples 1-7 optionally include an underfill material between the ceramic interposer and the I/O die, the underfill material also between the bottom die and the I/O die, and the underfill material between the bottom die and the first chiplet; and a molding mass contacting the ceramic interposer, the bottom die, the I/O die and the first chiplet.

In Example 9, the subject matter of any one or more of Examples 1-8 optionally include wherein the I/O die is a first I/O device, further including a subsequent I/O die that bridges between the ceramic interposer and the bottom die, wherein the first chiplet is part of a die array that is coupled to the ceramic interposer through the first I/O die, and wherein an Nth chiplet is on the bottom die and is coupled to the ceramic interposer through the subsequent I/O die.

In Example 10, the subject matter of any one or more of Examples 1-9 optionally include wherein the I/O die is a first I/O die, further including: a subsequent I/O die that bridges between the ceramic interposer and the bottom die, wherein the first chiplet is part of a die array that is coupled to the ceramic interposer through the first I/O die; an Nth chiplet on the bottom die, wherein the Nth chiplet is coupled to the ceramic interposer through the subsequent I/O die; a subsequent chiplet adjacent the first chiplet, wherein the subsequent chiplet is part of the die array, and wherein the subsequent chiplet is coupled to the ceramic interposer through the first I/O die; and an Nth subsequent chiplet adjacent the Nth chiplet, wherein the Nth subsequent chiplet is coupled to the ceramic interposer through the subsequent I/O die.

In Example 11, the subject matter of any one or more of Examples 1-10 optionally include wherein the ceramic interposer is a first ceramic interposer, further including a subsequent ceramic interposer between the first ceramic interposer and the bottom die, wherein the subsequent ceramic interposer encases a subsequent through-ceramic interconnect (TCI) pillar, wherein the I/O die bridges between the first and subsequent ceramic interposers and the subsequent ceramic interposer and the bottom die.

In Example 12, the subject matter of any one or more of Examples 1-11 optionally include wherein the I/O die is a first I/O die, wherein the ceramic interposer is a first ceramic interposer, further including: a subsequent ceramic interposer between the first ceramic interposer and the bottom die, wherein the subsequent ceramic interposer encases a subsequent through-ceramic interconnect (TCI) pillar, wherein the first I/O die bridges between the first and subsequent ceramic interposers and the subsequent ceramic interposer and the bottom die; a subsequent I/O die that bridges between the first ceramic interposer and the bottom die, wherein the first chiplet is part of a die array that is coupled to the first ceramic interposer through the first I/O die, and wherein an Nth chiplet is on the bottom die and is coupled to the first ceramic interposer through the subsequent I/O die.

In Example 13, the subject matter of any one or more of Examples 1-12 optionally include wherein the I/O die is a first I/O die, wherein the ceramic interposer is a first ceramic interposer, further including: a subsequent ceramic interposer between the first ceramic interposer and the bottom die, wherein the subsequent ceramic interposer encases a subsequent through-ceramic interconnect (TCI) pillar, wherein the first I/O die bridges between the first and subsequent ceramic interposers and the subsequent ceramic interposer and the bottom die; a subsequent I/O die that bridges between the first ceramic interposer and the subsequent interposer, and between the subsequent interposer and the bottom die, wherein the first chiplet is part of a die array that is coupled to the first ceramic interposer through the first I/O die, and wherein an Nth chiplet is on the bottom die and is coupled to the first ceramic interposer through the subsequent I/O die; an Nth chiplet on the bottom die, wherein the Nth chiplet is coupled to the first ceramic interposer through the subsequent I/O die; a subsequent chiplet adjacent the first chiplet, wherein the subsequent chiplet is part of the die array, and wherein the subsequent chiplet is coupled to the first ceramic interposer through the first I/O die; and an Nth subsequent chiplet adjacent the Nth chiplet, wherein the Nth subsequent chiplet is coupled to the subsequent ceramic interposer through the subsequent I/O die.

In Example 14, the subject matter of any one or more of Examples 1-13 optionally include wherein the ceramic interposer is a first ceramic interposer, further including a subsequent ceramic interposer that is semi-circularly surrounded by the first ceramic interposer, wherein the subsequent ceramic interposer encases a subsequent through-ceramic interconnect (TCI) pillar, wherein the I/O die bridges between the first and subsequent ceramic interposers and the subsequent ceramic interposer and the bottom die.

In Example 15, the subject matter of any one or more of Examples 1-14 optionally include wherein the ceramic interposer is a first ceramic interposer, wherein the I/O die is a first I/O die, further including: a subsequent ceramic interposer that is semi-circularly surrounded by the first ceramic interposer, wherein the subsequent ceramic interposer encases a subsequent through-ceramic interconnect (TCI) pillar, wherein the first I/O chip bridges between the first and subsequent ceramic interposers and the subsequent ceramic interposer and the bottom die; a subsequent I/O die that bridges between the first ceramic interposer and the subsequent interposer, and between the subsequent ceramic interposer and the bottom die, wherein the first chiplet is part of a die array that is coupled to the first ceramic interposer through the first I/O die, and wherein an Nth chiplet is on the bottom die and is coupled to the first ceramic interposer through the subsequent I/O die; an Nth chiplet on the bottom die, wherein the Nth chiplet is coupled to the first ceramic interposer through the subsequent I/O die; a subsequent chiplet adjacent the first chiplet, wherein the subsequent chiplet is part of the die array, and wherein the subsequent chiplet is coupled to the first ceramic interposer through the first I/O die; and an Nth subsequent chiplet adjacent the Nth chiplet, wherein the Nth subsequent chiplet is coupled to the subsequent ceramic interposer through the subsequent I/O die.

In Example 16, the subject matter of any one or more of Examples 1-15 optionally include a semiconductor device substrate to which the ceramic interposer and the bottom die are bonded.

In Example 17, the subject matter of any one or more of Examples 1-16 optionally include a semiconductor device substrate to which the ceramic interposer and the bottom die are bonded; a hoard on the semiconductor device substrate at a land side of the ceramic interposer and the bottom die; and an external shell on the board, wherein the external shell is a dielectric material.

In Example 18, the subject matter of any one or more of Examples 1-17 optionally include a semiconductor device substrate to which the ceramic interposer and the bottom die are bonded; a board on the semiconductor device substrate at a land side opposite the die side, and wherein the semiconductive device is part of a chipset.

Example 19 is a process of assembling a semiconductor device package, comprising: connecting an input-output device (I/O die) between a ceramic interposer and a bottom die; connecting a first semiconductive device (first chiplet) to the bottom die, to couple the ceramic interposer with the first chiplet through the I/O die; and at least partially encapsulating the ceramic interposer, the I/O die, the bottom die and the first chiplet in an encapsulation mass.

In Example 20, the subject matter of Example 19 optionally includes seating the ceramic interposer and bottom die on a semiconductor package substrate by electrical bumping.

In Example 21, the subject matter of any one or more of Examples 19-20 optionally include connecting a subsequent chiplet to the bottom die.

In Example 22, the subject matter of any one or more of Examples 19-21 optionally include wherein the ceramic interposer is a first ceramic interposer, further including: connecting a subsequent ceramic interposer to the I/O die, wherein the subsequent ceramic interposer is between the first ceramic interposer and the bottom die.

In Example 23, the subject matter of any one or more of Examples 19-22 optionally include wherein the ceramic interposer is a first ceramic interposer, further including: connecting a subsequent ceramic interposer to the I/O die, wherein the subsequent ceramic interposer is between the first ceramic interposer and the bottom die; connecting a subsequent chiplet to the bottom die.

In Example 24, a semiconductor device package, comprising: an overmolding mass; a ceramic interposer in the overmolding mass, wherein the ceramic interposer encases a through-ceramic interconnect (TCI) pillar; a bottom semiconductive device (bottom die) in the overmolding mass and adjacent the ceramic interposer, wherein the bottom die includes at least one through-silicon via (TSV); a first semiconductive device (first chiplet) coupled to the bottom die by contact with a first electrical bump; a subsequent chiplet coupled to the bottom by contact with a subsequent electrical bump; an interconnecting (I/O) semiconductive device (I/O die) coupled to the TCI pillar by contact with an interconnecting bump, and coupled to the bottom die by an I/O bump, wherein the I/O die and the first chiplet are coupled through the bottom die; wherein the I/O die and the first chiplet are adjacent each other, wherein the I/O die bridges between the ceramic interposer and the bottom die, wherein underfill materials contact the ceramic interposer and the I/O die, the first chiplet and the bottom die, and wherein the overmolding mass encapsulates a non-total portion of each of the ceramic interposer, the bottom die, the I/O die and the first chiplet wherein the ceramic interposer includes at least two ceramic layers that encase the TCI pillar, wherein each of the at least two ceramic layers is of a different ceramic material; and wherein the I/O die has an I/O fabrication-size geometry, wherein the first chiplet has a first fabrication-size geometry, and wherein the first fabrication-size geometry is smaller than the I/O fabrication-size geometry.

In Example 25, the subject matter of Example 24 optionally includes a semiconductor package substrate that is bonded to the ceramic interposer and the bottom die by electrical bumps; a board that is bonded to the semiconductor package substrate; and a heat sink that is bonded through a thermal interface material (TIM) to the I/O die at a backside surface, to the first chiplet through the TIM at a backside surface and to the subsequent chiplet at a backside surface.

In Example 26, the subject matter of any one or more of Examples 24-25 optionally include wherein the smaller I/O fabrication-size geometry is also achieved by a process chemistry that is different from a process chemistry by which the I/O die is achieved.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor device, comprising:
a first semiconductor die coupled to a substrate;
a ceramic interposer coupled to the substrate laterally adjacent to the first semiconductor die, the ceramic interposer including one or more interconnect pillars passing through at least one ceramic layer, wherein a top surface of the ceramic interposer is at a same height as a top surface of the first semiconductor die;
a second semiconductor die coupled across at least a portion of the top surface of the ceramic interposer and at least a portion of the top surface of the first semiconductor die;
an overmold that encases the ceramic interposer and the first semiconductor die, and sides of the second semiconductor die, leaving a top surface of the second semiconductor die level with a top of the overmold.

2. The semiconductor device of claim 1, wherein the first semiconductor die includes a silicon interposer die.

3. The semiconductor device of claim 2, wherein the second semiconductor die includes an I/O die.

4. The semiconductor device of claim 1, further including a third semiconductor die coupled to the top surface of the first semiconductor die, laterally adjacent to the second semiconductor die.

5. The semiconductor device of claim 1, wherein the ceramic interposer is comprised of multiple ceramic layers.

6. The semiconductor device of claim 5, wherein the multiple ceramic layers include different ceramic materials in different ceramic layers.

7. The semiconductor device of claim 6, wherein the multiple ceramic layers include strontium titanate and barium titanate.

8. The semiconductor device of claim 4, further including an integrated heat spreader in thermal contact with a top surface of both the second semiconductor die and the third semiconductor die.

9. The semiconductor device of claim 8, further including a thermal interface material between the integrated heat spreader and the top surface of both the second semiconductor die and the third semiconductor die.

10. A semiconductor device, comprising:
a first semiconductor die coupled to a substrate;
a ceramic interposer coupled to the substrate laterally adjacent to the first semiconductor die, wherein a top surface of the ceramic interposer is at a same height as a top surface of the first semiconductor die;
a second semiconductor die coupled across at least a portion of the top surface of the ceramic interposer and at least a portion of the top surface of the first semiconductor die;
a third semiconductor die coupled to the top surface of the first semiconductor die, laterally adjacent to the second semiconductor die; and
a fourth semiconductor die coupled to the top surface of the first semiconductor die, laterally adjacent to the third semiconductor die.

11. The semiconductor device of claim 10, further including an overmold that encases the ceramic interposer and the first semiconductor die.

12. The semiconductor device of claim 11, further including an underfill between the overmold and the substrate, the underfill encasing one or more solder bumps.

13. The semiconductor device of claim 10, wherein the ceramic interposer is comprised of multiple ceramic layers.

14. The semiconductor device of claim 13, wherein the multiple ceramic layers include different ceramic materials in different ceramic layers.

15. The semiconductor device of claim 14, wherein the multiple ceramic layers include strontium titanate and barium titanate.

16. The semiconductor device of claim 10, further including an integrated heat spreader in thermal contact with a top surface of both the second semiconductor die and the third semiconductor die.

17. The semiconductor device of claim 16, further including a thermal interface material between the integrated heat spreader and the top surface of both the second semiconductor die and the third semiconductor die.

18. The semiconductor device of claim 10, further including a solder bump array on a bottom surface of the substrate.

* * * * *